(12) United States Patent
Grolier et al.

(10) Patent No.: US 8,796,714 B2
(45) Date of Patent: Aug. 5, 2014

(54) LIGHT-EMITTING DIODE COMPRISING A CARRIER BODY, A MIRROR LAYER, AND TWO CONTACT LAYERS

(75) Inventors: Vincent Grolier, München (DE); Magnus Ahlstedt, Regensburg (DE); Mikael Ahlstedt, München (DE); Dieter Eissler, Qing Pu Shanghai (CN)

(73) Assignee: OSRAM Opto Semiconductor GmbH (DE)

( * ) Notice: Subject to any disclaimer, the term of this patent is extended or adjusted under 35 U.S.C. 154(b) by 15 days.

(21) Appl. No.: 13/263,789

(22) PCT Filed: Mar. 25, 2010

(86) PCT No.: PCT/EP2010/053942
§ 371 (c)(1),
(2), (4) Date: Dec. 21, 2011

(87) PCT Pub. No.: WO2010/124915
PCT Pub. Date: Nov. 4, 2010

(65) Prior Publication Data
US 2012/0112226 A1 May 10, 2012

(30) Foreign Application Priority Data
Apr. 28, 2009 (DE) .......................... 10 2009 019 161

(51) Int. Cl.
*H01L 33/00* (2010.01)
*H01L 27/14* (2006.01)
*H01L 31/0232* (2014.01)
*H01L 31/0203* (2014.01)
*H01L 27/146* (2006.01)

(52) U.S. Cl.
USPC ............... 257/98; 257/99; 257/100; 257/431; 257/432; 257/433; 257/435; 257/436

(58) Field of Classification Search
USPC ............ 257/100, 432, 98, 431, 99, 433, 436, 257/435, E31.117, E33.059
See application file for complete search history.

(56) References Cited

U.S. PATENT DOCUMENTS 6,730,940 B1 * 5/2004 Steranka et al. ................ 257/98
7,078,732 B1 7/2006 Reeh et al.
(Continued)

FOREIGN PATENT DOCUMENTS

CN 101176212 A 5/2008
DE 10 2007 022 947 A1 10/2008
(Continued)

OTHER PUBLICATIONS

The Chinese Examination Report issued on Oct. 21, 2013 in corresponding Chinese Patent Application No. 201080018556.3.
Japanese Examination Report dispatched Jan. 6, 2014 from corresponding Japanese Patent Application No. 2012-507659.

*Primary Examiner* — Michael Jung
*Assistant Examiner* — Jay C Chang
(74) *Attorney, Agent, or Firm* — DLA Piper LLP (US)

(57) ABSTRACT

A light emitting diode includes a semiconductor body including an active region that produces radiation, a carrier body fastened to the semiconductor body on an upper side of the semiconductor body, the carrier body including a luminescence conversion material consisting of a ceramic luminescence conversion material, a mirror layer applied to the semiconductor body on an underside of the semiconductor body remote from the upper side, and two contact layers, a first contact layer of the contact layers connected electrically conductively to an n-conducting region of the semiconductor body and a second contact layer of the contact layers connected electrically conductively to a p-conducting region of the semiconductor body.

7 Claims, 4 Drawing Sheets

(56) References Cited

U.S. PATENT DOCUMENTS

| | | |
|---|---|---|
| 7,446,344 B2 | 11/2008 | Fehrer et al. |
| 2002/0074558 A1 | 6/2002 | Hata et al. |
| 2003/0057444 A1 | 3/2003 | Niki et al. |
| 2004/0056254 A1 | 3/2004 | Bader et al. |
| 2005/0012109 A1 | 1/2005 | Kohno et al. |
| 2006/0186424 A1 | 8/2006 | Fujimoto et al. |
| 2006/0202105 A1 | 9/2006 | Krames et al. |
| 2006/0202216 A1 | 9/2006 | Itonaga |
| 2007/0080362 A1 | 4/2007 | Scotch et al. |
| 2007/0126017 A1* | 6/2007 | Krames et al. ............. 257/98 |
| 2007/0284601 A1 | 12/2007 | Khanarian |
| 2007/0295985 A1 | 12/2007 | Weeks, Jr. et al. |
| 2008/0116467 A1 | 5/2008 | Mueller et al. |
| 2009/0065800 A1* | 3/2009 | Wirth et al. ............. 257/100 |
| 2009/0146165 A1* | 6/2009 | Hasnain et al. ............. 257/98 |
| 2009/0224273 A1* | 9/2009 | Sakamoto et al. ............. 257/98 |
| 2010/0171135 A1 | 7/2010 | Engl et al. |

FOREIGN PATENT DOCUMENTS

| | | |
|---|---|---|
| JP | 2004-297095 | 10/2004 |
| JP | 2006-253172 | 9/2006 |
| JP | 2006-332714 | 12/2006 |
| JP | 2006-352085 | 12/2006 |
| JP | 2007-294956 | 11/2007 |
| WO | 2008/096214 | 8/2008 |
| WO | 2008/131736 | 11/2008 |
| WO | 2010/072187 A2 | 7/2010 |

* cited by examiner

LIGHT-EMITTING DIODE COMPRISING A CARRIER BODY, A MIRROR LAYER, AND TWO CONTACT LAYERS

RELATED APPLICATIONS

This is a §371 of International Application No. PCT/EP2010/053942, with an international filing date of Mar. 25, 2010 (WO 2010/124915, published Nov. 4, 2010), which is based on German Patent Application No. 10 2009 019 161.5, filed Apr. 28, 2009, the subject matter of which is incorporated by reference.

TECHNICAL FIELD

This disclosure relates to a light-emitting diode. The light-emitting diode is a lumenescent diode, which comprises at least one active region, in which electromagnetic radiation is produced when the light-emitting diode is in operation.

SUMMARY

We provide a light-emitting diode including a semiconductor body including an active region that produces radiation, a carrier body fastened to the semiconductor body on an upper side of the semiconductor body, the carrier body including a luminescence conversion material consisting of a ceramic luminescence conversion material, a mirror layer applied to the semiconductor body on an underside of the semiconductor body remote from the upper side, and two contact layers, a first contact layer of the contact layers connected electrically conductively to an n-conducting region of the semiconductor body and a second contact layer of the contact layers connected electrically conductively to a p-conducting region of the semiconductor body.

We also provide a method of producing a light-emitting diode in the following sequence including providing a semiconductor body, applying a carrier body to an upper side of the semiconductor body, detaching a growth substrate from the semiconductor body, producing a mirror layer on an underside of the semiconductor body remote from the carrier body, producing channels through the mirror layer and/or the carrier body into the semiconductor body and/or towards the semiconductor body, filling the channels with electrically conductive material, and forming contact layers connected electrically conductively with the electrically conductive material.

We further provide a light-emitting diode including a semiconductor body including an active region that produces radiation, a carrier body fastened to the semiconductor body on an upper side of the semiconductor body, a mirror layer applied to the semiconductor body on an underside of the semiconductor body remote from the upper side, two contact layers, a first contact layer of the contact layers connected electrically conductively with an n-conducting region of the semiconductor body and a second contact layer of the contact layers connected electrically conductively with a p-conducting region of the semiconductor body, at least one channel is introduced from at least one of the contact layers into the semiconductor body and/or towards the semiconductor body, which channel is filled with an electrically conductive material connected electrically conductively to the semiconductor body and one of the contact layers, wherein at least one of the at least one channel passes through the carrier body, and outcoupling structures arranged between the semiconductor body and the carrier body, refractive indices of materials of the outcoupling structures and of the semiconductor body differing from one another by at most 30%.

DETAILED DESCRIPTION

Figure 1A:
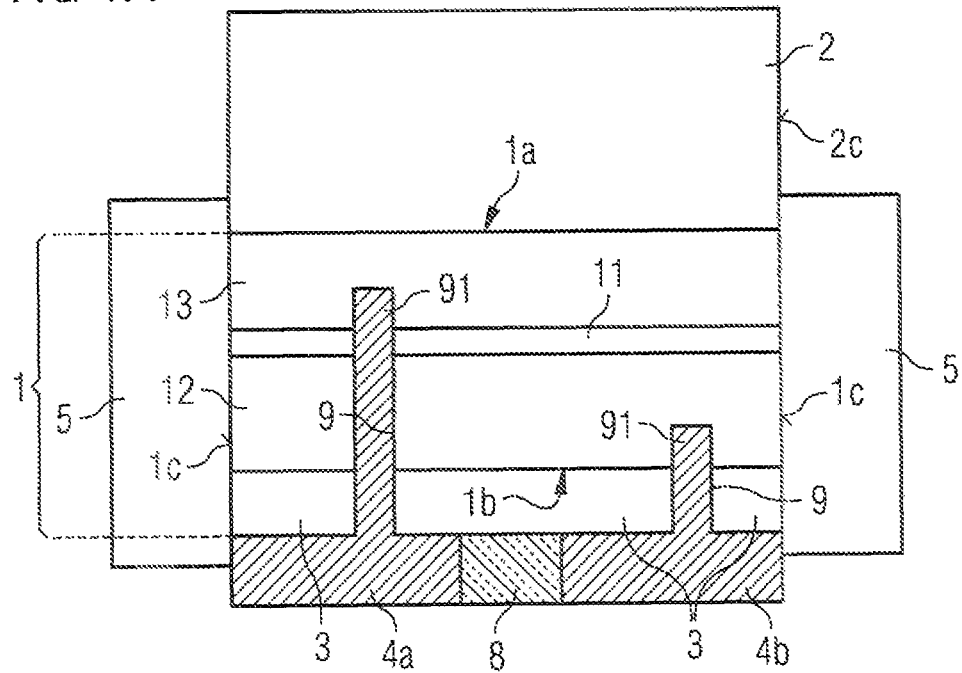
FIGS. 1A, 1B and 2 show, by way of schematic sectional representations, examples of a light-emitting diode described herein.

The light-emitting diode may comprise a semiconductor body, the semiconductor body comprising the active region provided for producing radiation. The semiconductor body is grown epitaxially, for example.

The light-emitting diode may comprise a carrier body. The carrier body is mechanically self-supporting, i.e., the carrier body can support itself mechanically and no additional carrier element is needed to support the carrier body. The carrier body is a mechanically rigid carrier layer, for example.

The carrier body is fastened to the semiconductor body on the upper side of the semiconductor body. The carrier body may be fastened to the semiconductor body, for example, by a connecting means. In particular, the carrier body is not a growth substrate for the semiconductor body. Instead, it is possible for a growth substrate to be removed from the semiconductor body.

The carrier body is then adhered to the semiconductor body, for example, on the upper side thereof. It is additionally possible for the carrier body and the semiconductor body to be joined together by methods such as anodic bonding or direct bonding. In this case no connecting means is arranged between carrier body and semiconductor body.

The carrier body provides mechanical support for the semiconductor body, i.e., the carrier body lends mechanical stability to the light-emitting diode comprising carrier body and semiconductor body.

The carrier body may comprise a luminescence conversion material. The luminescence conversion material may, for example, be applied as a thin layer to the outer surface of the carrier body. It is additionally possible for the luminescence conversion material to be introduced into the carrier body in the form of particles and, for example, dissolved therein. Finally, it is possible for the carrier body to consist of a luminescence conversion material. The carrier body may then consist of a ceramic luminescence conversion material, for example.

The light-emitting diode may comprise a mirror layer applied to the semiconductor body on the underside of the semiconductor body remote from the upper side. The mirror layer reflects electromagnetic radiation produced in the active region when the light-emitting diode is in operation. In addition, the mirror layer reflects light wavelength-converted by the luminescence conversion material. The mirror layer may to this end be formed, for example, of a dielectric material, a layer sequence of dielectric materials, a metal or a combination of the stated materials.

The light-emitting diode may comprise two contact layers. The first of the two contact layers is connected with an n-conducting region of the semiconductor body, while the second of the contact layers is connected electrically conductively to a p-conducting region of the semiconductor body. By way of the contact layers, the light-emitting diode may thus be electrically contacted from the outside and the active region supplied with the electrical power needed to operate the light-emitting diode.

It is possible for both contact layers to be arranged on a side of the mirror layer remote from the semiconductor body. If the mirror layer is formed of an electrically conductive material such as, for example, a metal, the contact layers are electrically insulated from the mirror layer. If the mirror layer is formed of an electrically conductive material, it is additionally also possible for parts of the mirror layer to form the contact layers.

It is furthermore possible for the first contact layer to be arranged on a side of the mirror layer remote from the semiconductor body. The second contact layer may then be arranged on a side of the carrier body remote from the semiconductor body.

The light-emitting diode may comprise a semiconductor body, the semiconductor body comprising an active region provided for producing radiation. The light-emitting diode further comprises a carrier body fastened to the semiconductor body on the upper side thereof, the carrier body comprising a luminescence conversion material. In addition, the light-emitting diode comprises a mirror layer applied to the semiconductor body on the underside of the semiconductor body remote from the upper side. The light-emitting diode further comprises two contact layers, a first one of the contact layers being connected electrically conductively with an n-conducting region of the semiconductor body and a second one of the contact layers being connected electrically conductively with a p-conducting region of the semiconductor body.

The carrier body of the light-emitting diode advantageously assumes various functions in the light-emitting diode:

the carrier body forms a carrier for the semiconductor body and thus the mechanically supporting component of the light-emitting diode;

the carrier body further forms a conversion medium, by means of which electromagnetic radiation produced in the active zone may be converted at least in part into radiation of a different, preferably higher, wavelength. For example, the light-emitting diode is suitable, when in operation, for emitting white mixed light composed of the light reemitted by the luminescence conversion material and the electromagnetic radiation produced in the active region;

the carrier body may further form a scatter center. If the carrier body is formed, for example, from a ceramic luminescence conversion material, it also exhibits, in addition to its frequency-converting properties, a light-scattering effect which contributes to the thorough mixing of the electromagnetic radiation emerging from the light-emitting diode. It is additionally possible for a light-scattering material to be introduced into or applied onto the carrier body; and in addition, the carrier body forms a protective layer for the semiconductor body which may protect the semiconductor body against chemical and/or mechanical damage.

The electromagnetic radiation of the light-emitting diode produced in the active region during operation may be outcoupled only through the carrier body. That is to say, the electromagnetic radiation produced in the active region during operation may leave the light-emitting diode only through the carrier body. To achieve this, measures may be taken to prevent outcoupling of the electromagnetic radiation through side faces of the chip.

At least one side face of the carrier body may end flush with at least one side face of the semiconductor body. A side face of the semiconductor body is a surface which extends from the upper side to the underside of the semiconductor body and, for example, connects a bottom face of the semiconductor body at the underside thereof with a top face of the semiconductor body at the upper side thereof. Likewise, the side face of the carrier body is a surface which bounds the carrier body laterally. At least one side face of the carrier body may then end flush with a side face of the semiconductor body. In an extreme case it is possible for all the side faces or the entire side face of the carrier body to end flush with all the side faces or with the entire side face of the semiconductor body. Semiconductor body and carrier body in this case, for example, exhibit the same cross-sectional area, and do not project beyond one another. Examples in which the carrier body and the semiconductor body do not project laterally beyond one another also include those examples in which the cross-sectional areas of semiconductor body and carrier body differ by at most 10% from one another.

The light-emitting diode comprises a covering layer which completely covers at least one side face of the semiconductor body. Preferably, the covering layer then completely covers all the side faces of the semiconductor body. The covering layer may be provided to protect the side faces of the semiconductor body from exposure to chemical and/or mechanical loads. It is additionally possible for the covering layer to be radiation-opaque such that electromagnetic radiation cannot leave the semiconductor body through the side faces thereof. The covering layer then, for example, comprises a radiation-reflecting layer which may be formed with a dielectric material such as silicon oxide, silicon nitride or aluminium oxide. Finally, it is possible for the covering layer to take the form of an antireflective layer. In this case, it is desirable to couple electromagnetic radiation out of the semiconductor body through the side faces thereof. Electromagnetic radiation may then leave the light-emitting diode not only through the carrier body but also, albeit unconverted, through the side face.

The covering layer may cover the carrier body and/or the mirror layer at the side, i.e., it is possible for the covering layer to extend not only along the side faces of the semiconductor body, but also to cover side faces of the carrier body and the mirror layer. If, in particular, the covering layer is radiation-reflecting, a particularly large proportion of electromagnetic radiation may be reflected towards the carrier body. In addition, the covering layer also contributes to chemical and/or mechanical protection of the carrier body and/or the mirror layer.

Outcoupling structures may be arranged between the semiconductor body and the carrier body, the refractive indices of the materials of the outcoupling structures and of the semiconductor body differing from one another by at most 30%. The outcoupling structures are applied, for example, as truncated pyramids to the radiation exit face of the semiconductor body facing the carrier body. Electromagnetic radiation is able to pass from the semiconductor body into the outcoupling structures with only slight optical losses due to the slight or non-existent difference in refractive index between the material of the outcoupling structures and the material of the semiconductor body. The outcoupling structures preferably comprise side faces which form an angle greater than 0 and smaller than 90° with the radiation exit face of the semiconductor body facing the carrier body. The probability of electromagnetic radiation leaving the outcoupling structures without total reflection is thus greater than would be case with a semiconductor body without outcoupling structures. The outcoupling structures may in this case consist of the same material as the semiconductor body and then take the form, for example, of roughened portions of the semiconductor body.

The material of the outcoupling structures may be different from the material of the semiconductor body. The outcoupling structures, for example, contain at least one of the following materials or consist of one of the following materials: titanium oxide, zinc sulfide, aluminium nitride, silicon carbide, boron nitride and tantalum oxide.

The outer surface of the carrier body may be roughened and/or coated with an antireflective coating. For example, the side of the carrier body facing the semiconductor body and/or the side remote from the semiconductor body are treated as described. This reduces the probability of reflection of electromagnetic radiation on passage through the carrier body. All in all, the probability of light outcoupling into and out of the carrier body is increased thereby.

A connecting means is arranged between the semiconductor body and the carrier body which brings about a mechanical connection between the semiconductor body and the carrier body. The connecting means may, for example, be a radiation-transmissive adhesive with which the semiconductor body is fastened to the carrier body. This ensures a particularly resilient connection between carrier body and semiconductor body which is advantageous, particularly if the semiconductor body becomes warm during operation of the light-emitting diode. It is additionally possible for a layer to be applied to the outer surface of the semiconductor body facing the carrier body which layer consists, for example, of aluminium oxide. The same layer may also be applied to the outer surface of the carrier body facing the semiconductor body. The two layers may then be connected together by a bonding method such as anodic bonding or direct bonding such that a layer of a connecting means is arranged between carrier body and semiconductor body.

The refractive index of the connecting means may differ by at least 30% from the refractive index of the semiconductor body. This is particularly advantageous if outcoupling structures are arranged between the semiconductor body and the carrier body. In this case, the connecting means which, for example, has a significantly lower refractive index than the material of the semiconductor body and the material of the outcoupling structures, may surround the outcoupling structures at their exposed outer surfaces. Owing to the difference in refractive index between semiconductor body and connecting means and owing to the very similar refractive index of semiconductor body and outcoupling structures, electromagnetic radiation is preferably coupled into the outcoupling structures.

Channels may be introduced from the contact layers into the semiconductor body which channels are filled with an electrically conductive material. The channels in this case preferably also pass through the mirror layer and/or the carrier body, i.e., channels with electrically conductive material extend from the contact layers into the semiconductor body such that the semiconductor body may be contacted on both the n- and p-sides from its underside and/or its upper side via the contact layers. In particular, at least one channel is introduced from at least one of the contact layers into the semiconductor body and/or towards the semiconductor body, which channel is filled with an electrically conductive material. The electrically conductive material is in particular connected electrically conductively with the semiconductor body. The semiconductor body is then electrically contactable via the electrically conductive material.

The channels are, in particular, recesses in the mirror layer and/or in the carrier body and/or in the semiconductor body. The outer faces of the recesses facing the mirror layer and/or the carrier body and/or the semiconductor body may be coated with an electrically insulating material. The electrically conductive material, for example, a metal, is then introduced into the recesses at least in places.

A method of producing a light-emitting diode is additionally provided. The method may preferably be used to produce a light-emitting diode described herein, i.e., all the features disclosed for the light-emitting diode are also disclosed for the method and vice versa. The method may comprise the following steps:

providing a semiconductor body, applying a carrier body to the upper side of the semiconductor body, detaching a growth substrate from the semiconductor body, producing a mirror layer on the underside of the semiconductor body remote from the carrier body, producing channels through the mirror layer and/or the carrier body into the semiconductor body, filling the channels with an electrically conductive material, and forming contact layers, the contact layers being connected electrically conductively with the electrically conductive material.

The method is preferably performed in the stated sequence. In particular, the channels which lead into the semiconductor body are preferably formed only after application of the mirror layer and/or of the carrier body.

The carrier body preferably remains on the semiconductor body and comprises in particular a luminescence conversion material such that it may exhibit a dual function as carrier and as optical component.

The light-emitting diode described herein and the method described herein for producing a light-emitting diode are explained in greater detail below with reference to examples and associated figures.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

FIG. 1A shows by way of a schematic sectional representation a light-emitting diode described herein. The light-emitting diode comprises a semiconductor body 1. The semiconductor body 1 comprises an n-conducting region 13, a p-conducting region 12 and an active region 11, which is arranged between n-conducting region 13 and p-conducting region 12. When the light-emitting diode is in operation, electromagnetic radiation is produced in the active region 11. The electromagnetic radiation may leave the semiconductor body 1, for example, at the upper side 1a thereof. The arrangement of n-doped regions and p-doped regions may also be reversed.

The carrier body 2 is applied to the semiconductor body 1 on the upper side 1a thereof. In this case, the carrier body 2 consists of a ceramic luminescence conversion material such as, for example, YAG:Ce. The carrier body 2 may be adhered or bonded to the semiconductor body 1. In this case, the carrier body 2 is applied to the side of the semiconductor body 1 remote from the original growth substrate.

A covering layer 5 is arranged on the side faces 1c of the semiconductor body 1, which covering layer is reflective in this case such that electromagnetic radiation produced in the active region 11 during operation is reflected back from the covering layer 5 into the semiconductor body at the side faces 1c, for example, in the direction of the carrier body 2 or the mirror layer 3. The covering layer 5 may extend along both the side face 1c of the semiconductor body and the side faces 2c of the carrier body and at the side of the mirror layer 3 and the contact layers 4a, 4b.

The mirror layer 3 is applied to the semiconductor body 1 on the underside 1b thereof remote from the upper side 1a. In this case, the mirror layer 3 takes the form, for example, of a metallic mirror which contains silver or consists of silver. The mirror layer 3 is intended to reflect electromagnetic radiation produced in the active region 11 and frequency-converted in the carrier body 2 in the direction of the carrier body 2. If the mirror layer 3 is made from an electrically conductive material, it is electrically insulated from the contact layers 4a, 4b by means of a covering layer, not shown.

Contact layers 4a, 4b are arranged on the side of the mirror layer 3 remote from the semiconductor body, by which contact layers the light-emitting diode may be electrically contacted. Channels 9 extend from the contact layers 4a, 4b into the n-conducting region 13 or the p-conducting region 12. The channels 9 are filled with an electrically conductive material 91. The electrically conductive material 91 may be the same material, for example, as the contact layers 4a, 4b are also made from. Between the contact layers 4a, 4b an insulating layer 8 of a dielectric material is preferably arranged, which prevents a short-circuit between the two contact layers.

Overall, the light-emitting diode described in relation to FIG. 1A constitutes a particularly compact light-emitting diode which may be mounted directly on a printed circuit board, for example, without a further housing being necessary for the light-emitting diode. The light-emitting diode is distinguished, for example, in that in the light-emitting diode described, silicone is dispensed with, for example, as potting for the light-emitting diode or as a carrier for luminescence conversion material, i.e., the light-emitting diode described herein does not comprise any silicone. The light-emitting diode is distinguished by its compact structure and its small size and by the fact that no additional carrier element is needed in addition to the carrier body. The carrier body 2 provides mechanical support for the semiconductor body 1 such that it is possible to remove a growth substrate from the epitaxially produced layers of the semiconductor body and thus to obtain a particularly thin semiconductor body structure.

Figure 1B:
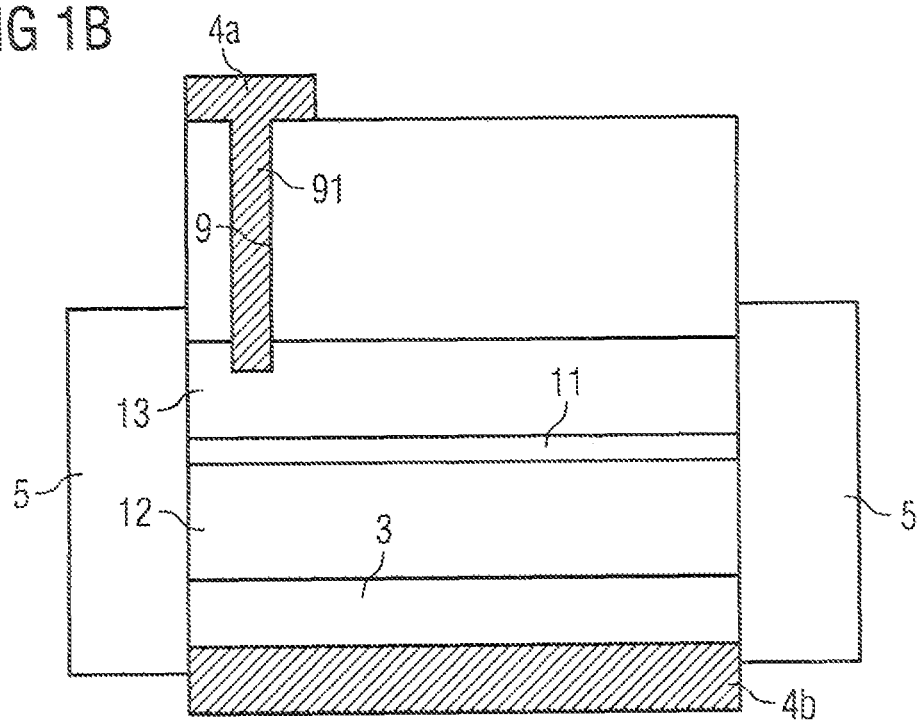

A further example of a light-emitting diode described herein is explained in greater detail in conjunction with FIG. 1B. Unlike the example described in conjunction with FIG. 1A, the light-emitting diode may here be contacted from different sides.

On the side of the carrier body 2 remote from the semiconductor body 1 the first contact layer 4a is arranged, via which the light-emitting diode may be electrically contacted. From the first contact layer 4a a channel 9 extends into the n-conducting region 13. Alternatively or in addition to a channel 9, the carrier body 2 could also be thinned or removed in the region of the first contact layer 4a.

On the side of the mirror layer 3 facing away from the semiconductor body 1 there is arranged the second contact layer 4b, which contacts the semiconductor body on the p-side, for example, via the electrically conductive mirror layer 3. Alternatively, a channel 9 may also be passed through the mirror layer to the p-conducting region 12.

The channels 9 are filled with an electrically conductive material 91. The electrically conductive material 91 may be the same material, for example, as the contact layers 4a, 4b are also made from.

Figure 2:
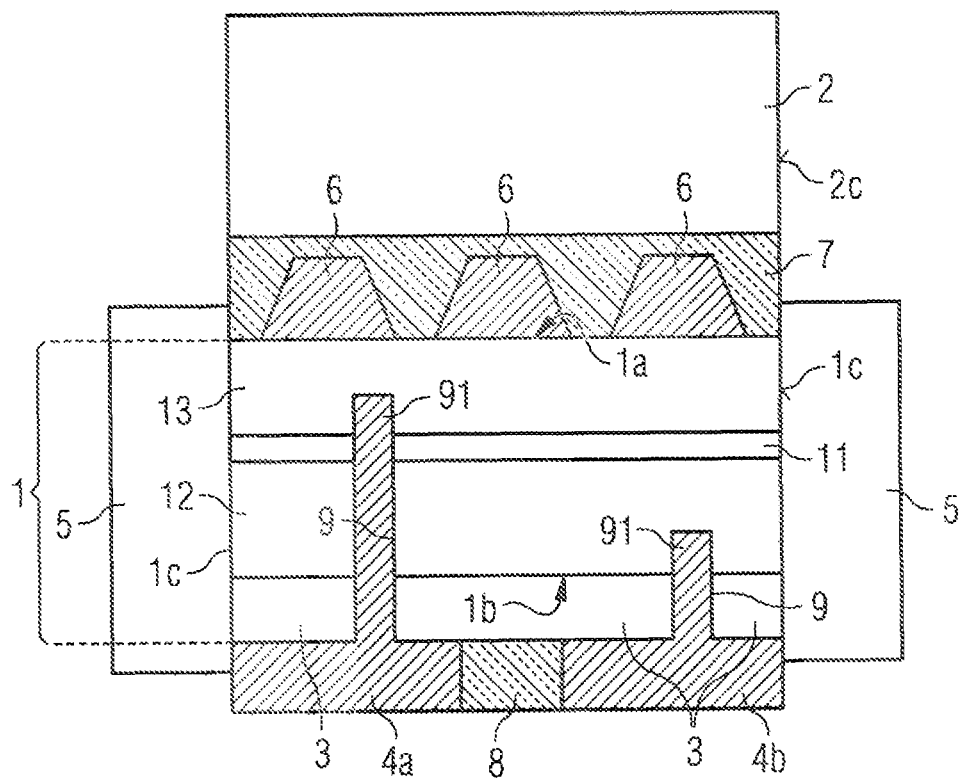

A further example of a light-emitting diode described herein is explained in greater detail in conjunction with FIG. 2. Unlike in the example of FIG. 1A, in the example of FIG. 2, a plurality of outcoupling structures 6 are arranged between the semiconductor body 1 and the carrier body 2. The outcoupling structures 6 take the form, for example, of truncated pyramids, which comprise side faces which extend obliquely relative to the radiation exit face on the upper side 1a of the semiconductor body 1. The outcoupling structures consist of a dielectric material with a similar refractive index to the semiconductor body. If the semiconductor body is based, for example, on gallium nitride, titanium oxide or tantalum oxide are particularly well suited to forming the outcoupling structures 6. Electromagnetic radiation passes from the semiconductor body into the outcoupling structures 6 from which it may be outcoupled particularly efficiently in the direction of the carrier body 2 owing to the oblique side faces. To connect the carrier body 2 to the semiconductor body 1, the outcoupling structures 6 are surrounded by a connecting means 7 which may, for example, comprise a transparent adhesive or a ceramic material. The carrier body 2 may then be connected to the semiconductor body 1, for example, by adhesion or bonding. The connecting means 7 may here exhibit a refractive index which is at least 30% lower than the refractive index of the material on which the semiconductor body is based. The carrier body 2 preferably consists of a ceramic material containing a luminescence conversion material or consisting of such a material.

An example of a method of producing a light-emitting diode described herein is explained in greater detail in conjunction with FIGS. 3A to 3F by schematic sectional representations.

Figure 3A:
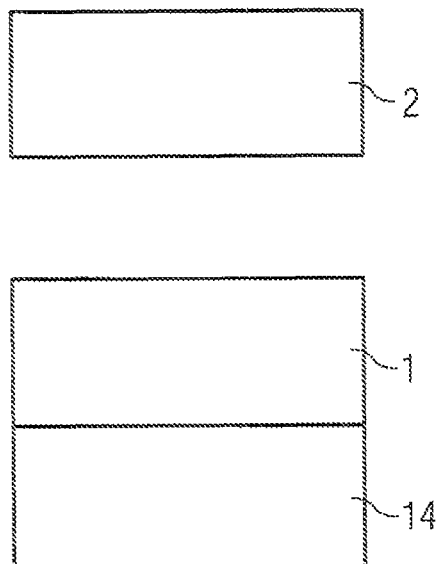
FIGS. 3A to 3F show, by way of schematic sectional representations, an example of a method described herein for producing a light-emitting diode.
Figure 3B:
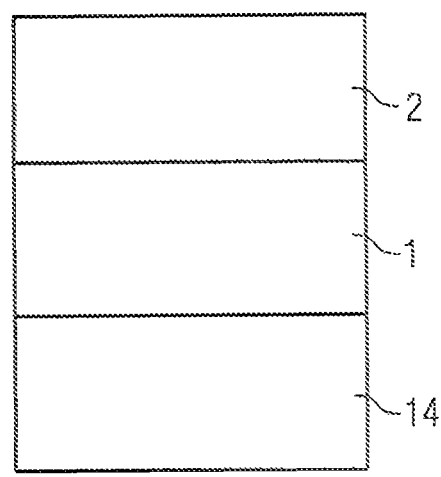

In a first method step, a carrier body 2 is applied to the top of the semiconductor body 1 remote from a growth substrate 14 for the semiconductor body and connected thereto, for example, by bonding (cf. FIGS. 3A and 3B).

Figure 3C:
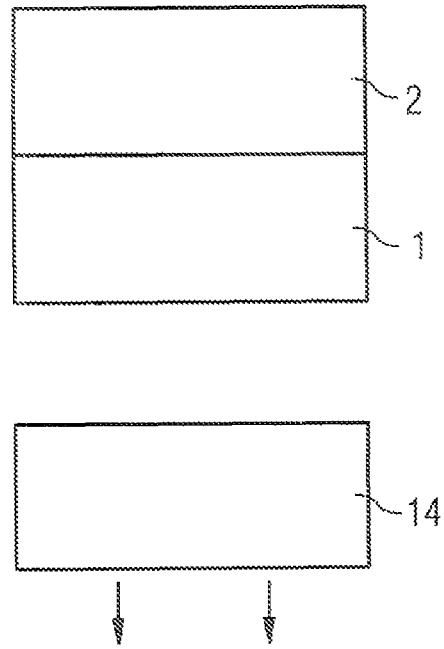
Figure 3D:
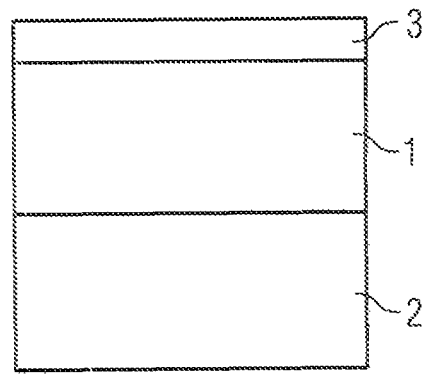

FIG. 3C shows that the growth substrate 14 is removed from the semiconductor body 1, for example, by laser lift-off FIG. 3D shows subsequent application of a mirror layer 3 to the underside of the semiconductor body 1 remote from the carrier body 2.

Figure 3E:
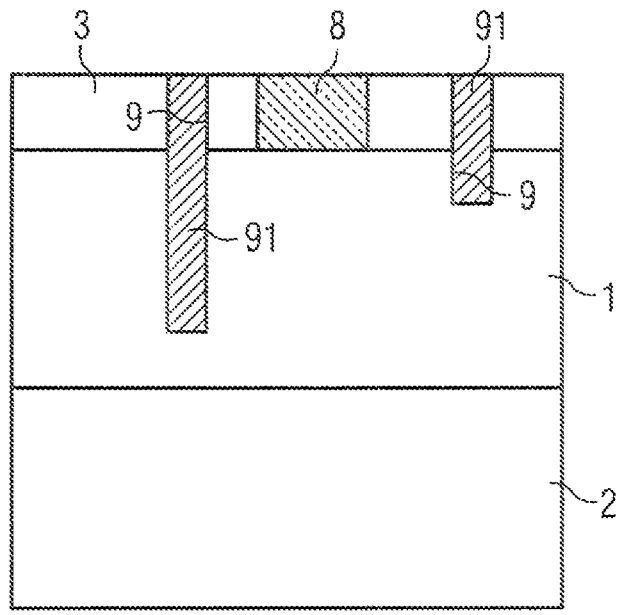

FIG. 3E shows that the mirror layer is patterned and channels 9 are introduced through the mirror layer and into the semiconductor body 1. An electrically conductive material 91 is introduced into the channels 9. It is also possible for an insulating layer 8 to be introduced between two regions of the mirror layer 3. The insulating layer 8 is made from an electrically insulating material. In this method step it is particularly advantageous for the mirror layer itself to consist of an electrically conductive material. In this case, it is possible to dispense with additional contact layers 4a, 4b and the light-emitting diode may be electrically contacted directly via the mirror layer 3.

Figure 3F:
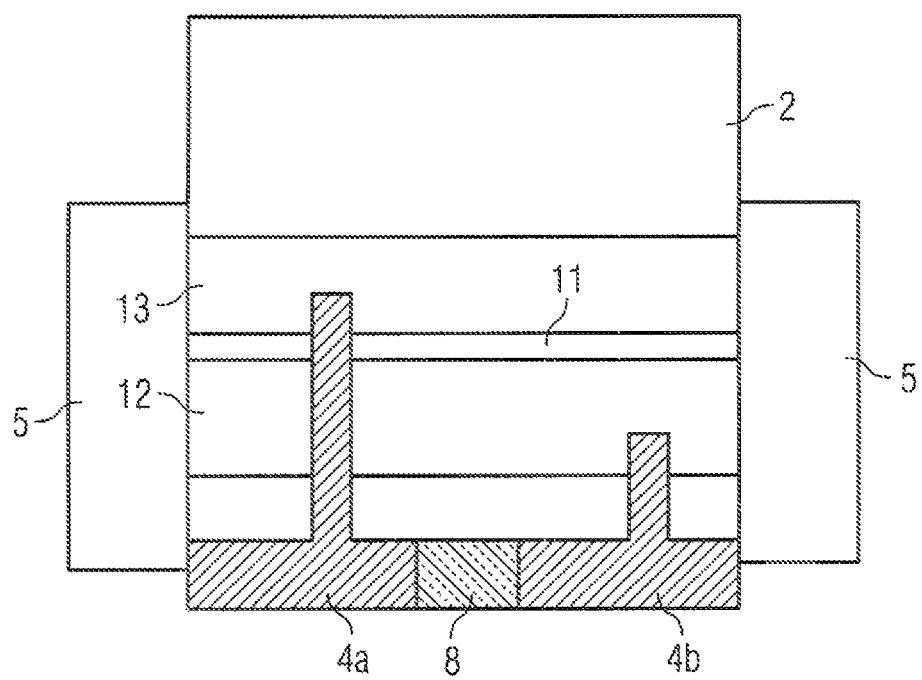

FIG. 3F shows completion of the light-emitting diode by application of contact layers 4a, 4b and application of a covering layer 5 to the side faces 1c of the semiconductor body.

The example described in conjunction with FIG. 2 of a light-emitting diode described herein may also be produced in the same way as shown in FIGS. 3A to 3F, outcoupling structures 6 being produced on the semiconductor body 1 before semiconductor body 1 and carrier body 2 are connected together. The outcoupling structures 6 may, for example, be produced by a masking method.

It is additionally possible to use the method to produce the example described in conjunction with FIG. 1B of a light-emitting diode described herein, channels 9 being produced in the mirror layer 3 and/or the carrier body 2.

The description made with reference to example does not restrict this disclosure to these examples. Rather, our diodes and methods encompass any novel feature and any combination of features, including in particular any combination of features in the appended claims, even if the feature or combination is not itself explicitly indicated in the claims or examples.

The invention claimed is:

1. A light-emitting diode comprising:
   a semiconductor body comprising an active region that produces radiation;
   a carrier body fastened to the semiconductor body on an upper side of the semiconductor body, the carrier body comprising a luminescence conversion material consisting of a ceramic luminescence conversion material;
   a mirror layer applied to the semiconductor body on an underside of the semiconductor body remote from the upper side; and
   two contact layers, a first contact layer of the contact layers connected electrically conductively to an n-conducting region of the semiconductor body and a second contact layer of the contact layers connected electrically conductively to a p-conducting region of the semiconductor body,
   wherein at least one channel is introduced from at least one of the contact layers into the semiconductor body, which channel is 1) filled with an electrically conductive material connected electrically conductively to the semiconductor body and one of the contact layers and 2) passes through the carrier body from an upper side of the carrier body to an underside of the carrier body and extends into a region of the semiconductor body containing semiconductor material.

2. The light-emitting diode according to claim 1, wherein the radiation produced in the active region during operation leaves the light-emitting diode only through the carrier body.

3. The light-emitting diode according to claim 1, wherein at least one side face of the carrier body ends flush with at least one side face of the semiconductor body.

4. The light-emitting diode according to claim 1, wherein a covering layer completely covers at least one side face of the semiconductor body.

5. The light-emitting diode according to claim 4, wherein the covering layer covers the carrier body and/or the mirror layer at the side.

6. The light-emitting diode according to claim 1, wherein the carrier body consists of a ceramic luminescence conversion material.

7. The light-emitting diode according to claim 1, wherein the contact layer to which the at least one channel is connected is arranged on a side of the carrier body remote from the semiconductor body.

\* \* \* \* \*

UNITED STATES PATENT AND TRADEMARK OFFICE
CERTIFICATE OF CORRECTION

| | | |
|---|---|---|
| PATENT NO. | : 8,796,714 B2 | Page 1 of 1 |
| APPLICATION NO. | : 13/263789 | |
| DATED | : August 5, 2014 | |
| INVENTOR(S) | : Grolier et al. | |

It is certified that error appears in the above-identified patent and that said Letters Patent is hereby corrected as shown below:

On the Title Page
At (73), please change "Semiconductor" to --Semiconductors--.

Signed and Sealed this
Twenty-fifth Day of November, 2014

Michelle K. Lee
*Deputy Director of the United States Patent and Trademark Office*